United States Patent [19]

Fröhlich

[11] Patent Number: 4,806,451

[45] Date of Patent: Feb. 21, 1989

[54] PROCESS FOR THE PRODUCTION OF MULTICOLOR PROOFS USING PRECOLORED TONING FILMS

[75] Inventor: Helmut H. Fröhlich, Heusenstamm, Fed. Rep. of Germany

[73] Assignee: E. I. Du Pont de Nemours and Company, Wilmington, Del.

[21] Appl. No.: 66,125

[22] Filed: Jun. 24, 1987

[30] Foreign Application Priority Data

Jul. 24, 1986 [DE] Fed. Rep. of Germany ....... 3625014

[51] Int. Cl.$^4$ .............................................. G03C 5/00
[52] U.S. Cl. .................................. 430/291; 430/292; 430/293
[58] Field of Search ...................... 430/291, 292, 293

[56] References Cited

U.S. PATENT DOCUMENTS

| 3,060,025 | 10/1962 | Burg et al. | 96/28 |
| 3,620,726 | 11/1971 | Chu et al. | 430/291 |
| 4,275,140 | 6/1981 | Neiss | 430/281 X |

FOREIGN PATENT DOCUMENTS 2949462  9/1983  Fed. Rep. of Germany .

*Primary Examiner*—Won H. Louie
*Assistant Examiner*—Cynthia Hamilton

[57] ABSTRACT

The invention relates to a process for producing an image on a light-sensitive tonable layer comprising the steps of:

(A) exposing the light-sensitive layer imagewise to produce imagewise tacky and complementary non-tacky areas;

(B) bringing the imagewise-exposed layer into surface-to-surface contact with a supported non-photosensitive transfer layer containing at least one finely divided powder and/or a dissolved dye in a binder; and (C) separating the transfer layer from the light-sensitive layer, whereby the transfer layer adheres selectively to the imagewise tacky areas, the improvement wherein, the binder of the transfer layer consists essentially of (a) about 55–97 wt. % of at least one polymer in the form of a powder having a minimum film-forming temperature of above 50° C., and (b) about 3–45 wt. % of at least one thermoplastic and/or one thermoplastic-elastomeric polymer, having a minimum film-forming temperature when used as a latex, or, a glass transition temperature when used as a dissolved polymer, which is at least 10° C. lower than the minimum film-forming temperature of polymer (a), whereby polymer phases (a) and (b) are incompatible.

9 Claims, No Drawings

PROCESS FOR THE PRODUCTION OF MULTICOLOR PROOFS USING PRECOLORED TONING FILMS

FIELD OF THE INVENTION

The subject of the present application is a process which utilizes a transfer layer for the production of an image on a tonable light-sensitive layer.

BACKGROUND OF THE INVENTION

In the photographic reproduction sector, light-sensitive reproduction materials are used in which differences in the tackiness of the exposed and unexposed areas of the light-sensitive layer are utilized to produce the image. Thus a reproduction process is known, e.g., from German Pat. Nos. 1,210,321 (U.S. Pat. No. 3,060,024), 1,904,058 (U.S. Pat. No. 3,620,726), 1,904,059 (U.S. Pat. No. 3,582,327), and 2,004,214, in which a tacky photopolymerizable reproduction material comprising a layer support and a photopolymerizable layer that contains at least one addition polymerizable monomer and a photo-polymerization initiator is hardened by imagewise exposure, whereby the exposed image areas lose their tackiness. The latent image is then made visible by applying suitable toner materials that only adhere to the unexposed tacky areas, whereas they can be removed from the exposed non-tacky image areas after application. Using this method, positive optionally colored images of the original are obtained that in appearance resemble images produced using printing inks. The process has therefore gained considerable practical importance for the proofing of color separations, especially in the printing industry.

The toner materials, consisting predominantly of finely divided powders, can be applied by dusting the imagewise exposed surface with the toner. According to another embodiment, the toner can be a layer of finely divided particles loosely bound on a separate support, which is transferred by bringing this support into contact with the imagewise exposed layer and applying heat. Thus it is known, e.g., from DE-PS No. 1,205,117 (U.S. Pat. No. 3,060,025), to use for this purpose a transfer layer comprising a thermoplastic binder and the toner material, applied onto a layer support.

Pigmented layers for the production of colored images are known from DE-PS No. 2,949,462 (U.S. Pat. No. 4,275,140) that contain 75-95 parts by weight of pigment and 25-5 parts by weight of an elastomeric binder. According to this process images of high opacity are obtained that are preferably used for the reproduction of brochures and exhibits. Due to their high opacity, however, such pigmented layers are not suitable for color proofing. Reducing the pigment content drastically does lead to a reduced density, but causes total loss of resolution. This state of affairs is illustrated in more detail in the examples.

It has not been possible hitherto to use these transfer layers to produce reproductions that meet the exacting requirements of the color-proofing industry for high-quality prints, above all with respect to the achievable resolution and uniformity of the tonal values over larger surfaces. In practice, therefore, the tacky areas can only be satisfactorily toned by dusting the exposed layer with finely divided powders, either by hand or using automatic applicators, although the use of a transfer layer would be much simpler, cleaner, and less polluting.

It is known in reproduction technology to use screened color separations as copy originals for the production of offset- or relief printing plates. Before the printing plates are exposed, the color separations are checked using color proofing methods to ascertain whether the later printing result will represent a reproduction of the original that has correct tonal values. According to general industry standards, a resolution of 2%-98% dots with a screen width of 60 lines/cm is required for a high-quality offset print. It is particularly difficult to achieve satisfactory resolution of the sharp 2% dots in the highlights and the 98% dots in the shadows. It is also of considerable importance for a good tonal value reproduction that dots of the same size have sharp edges over the entire surface area and be reproduced uniformly, i.e. without variations in their size.

It is therefore the object of the present invention to give a process for the production of reproductions on tonable light-sensitive layers which utilizes a transfer layer containing at least one finely divided powder and/or a dissolved dye, with which the resolution required by the printing industry can be achieved and that moreover excels in the high uniformity of its tonal values across the entire surface. This object is achieved by the use of a transfer layer according to the characterizing part of claim 1.

BRIEF SUMMARY OF THE INVENTION

The invention relates to a process for the production of an image on a tonable light-sensitive layer comprising the steps of:

(A) exposing the light-sensitive layer imagewise to produce imagewise tacky and complementary non-tacky areas;

(B) bringing the imagewise-exposed layer into surface-to-surface contact with a supported non-photosensitive transfer layer containing at least one finely divided powder and/or a dissolved dye in a binder; and (C) separating the transfer layer from the light-sensitive layer, whereby the transfer layer adheres selectively to the imagewise tacky areas, the improvement wherein, the binder of the transfer layer consists essentially of (a) about 55-97 wt.% of at least one polymer in the form of a powder having a minimum film-forming temperature of above 50° C., and (b) about 3-45 wt.% of at least one thermoplastic and/or one thermoplastic-elastomeric polymer, having a minimum film-forming temperature when used as a latex, or, a glass transition temperature when used as a dissolved polymer, which is at least 10° C. lower than the minimum film-forming temperature of polymer (a), whereby polymer phases (a) and (b) are incompatible.

DETAILED DESCRIPTION OF THE INVENTION

To produce polymer phase (a), in general a great variety of water-insoluble dispersible polymers are suitable. Preferred dispersible polymers are those produced by the emulsion polymerization method. In practice, water-dispersible polymers are particularly important thereby. The polymers can be used individually or mixed, and must be selected so that the minimum film-forming temperature of polymer phase (a) is >50° C. The minimum film-forming temperature (MFT) is the temperature at or above which a coated latex forms a coherent film by means of cold flow. The following should be named in particular: Homo- and/or copolymers including: methyl methacrylate, ethyl methacrylate, isopropyl methacrylate, butyl acrylate, 2-tert-butyl phenyl acrylate, 4-tert-butyl phenyl acrylate, 4-cyanophenyl acrylate, phenyl acrylate, benzyl methacrylate, 2-chloroethyl methacrylate, butyl methacrylate, 2-cyanoethyl methacrylate, cyclohexyl methacrylate, 2-hydroxy ethyl methacrylate, 2-hydroxy propyl methacrylate, phenyl methacrylate, acrylic acid, methacrylic acid, acrylamide, methacrylamide, acrylonitrile, styrene, vinyl compounds such as vinyl esters and vinyl chloride, vinylidene chloride, butadiene, etc.

Suitable thermoplastic or thermoplastic/elastomeric polymers for the production of polymer phase (b) are likewise known in large numbers and can be made from the monomers or comonomers respectively given under (a). Polymers based on acrylate and methacrylate are preferred, including homo- and/or copolymers of: methyl acrylate, ethyl acrylate, hydroxy ethyl acrylate, propyl acrylate, n-butyl acrylate, 2-ethyl hexyl acrylate, benzyl acrylate, cyanobutyl acrylate, cyanoethyl acrylate, cyclohexyl acrylate, pentyl acrylate, hexyl acrylate, acrylic ester copolymer with acrylonitrile, n-butyl methacrylate, pentyl methacrylate, and hexyl methacrylate.

Polyethylene oxide, polyvinyl alcohol, sodium carboxy methyl cellulose, and hydroxy ethyl cellulose have also proven good for the purposes of the present invention, whereby polyethylene oxides having a weight average molecular weight >500,000 are particularly important. It was in fact found that polyethylene oxides improve the adhesion between the transfer layer and the layer support, without impairing the achievable resolution capability. Good adhesion to the layer support leads to stable layers that are easy to handle, and that withstand the mechanical stresses of processing and do not tend to become detached from the layer support. According to a preferred embodiment, therefore, a polymer phase (b) is used that contains a percentage of polyethylene oxide having a weight average molecular weight >500,000.

Thermoplastic/elastomeric polymers such as styrene-isoprene copolymers, styrene-butadiene copolymers, polybutadiene, polyisoprene, polyisobutylene, polyvinylidene chloride, polyvinyl alkyl ether, polyvinyl propionate-acrylate copolymers, polyethylene vinyl acetate copolymers and polyethylene propylene copolymers are also suitable.

The respective minimum film-forming temperature or glass transition temperature, as the case may be, can be achieved without difficulty due to the general technical knowledge in this area, e.g., by selecting suitable comonomers and their relationship to one another or by using generally known measures such as, e.g., external plasticizing.

According to a preferred embodiment, the minimum film-forming temperature or glass transition temperature of polymer phase (b) is adjusted so that it lies below the temperature at which the exposed reproduction material and the transfer layer are brought into contact with one another. Polymers having a minimum film-forming temperature or glass transition temperature <50° C. are especially preferred. The polymers for the production of phase (b) can be used in the form of discrete particles but can also be applied in the dissolved form from solvents or solvent mixtures, respectively. In the latter case, the glass transition temperature is the characteristic quantity to be considered.

In the first case care must be taken to ensure that phase (b) forms a coherent film after drying. This can be done simply by selecting a drying temperature that lies above the minimum film-forming temperature of the polymer or polymer mixture.

Polymer phases (a) and (b) must be selected in each case so that the two phases are incompatible. Such a selection causes no difficulty to those skilled in the art and can easily be recognized, e.g., by the opacity of the layers or by thermoanalysis.

Suitable finely divided powders for image reproduction are known in large numbers from the literature, e.g., from DE-PS No. 1,904,058 (U.S. Pat. No. 3,620,726) and DE-PS No. 2,946,896 (U.S. Pat. Nos. 4,215,193 and 4,304,843). These powders are primarily pigments, although dissolved dyes can also be used. Examples are inorganic and organic pigments, phosphors, metal powders in pure form or together with an organic or inorganic powder support, such as titanium dioxide, $SiO_2$, glass powder, carbon (black or graphite), metal phthalocyanines, azo dyes, metal powders comprising aluminum, copper, iron, gold, or silver, or metal oxides and soluble organic dyes.

The coating material is produced by known methods. According to a preferred embodiment, the polymer components (a) and (b) are mixed together under agitation in the form of aqueous dispersions optionally in the presence of dispersing agents. According to another embodiment, polymer component (b) can also be added to the dispersed polymer component (a) (dissolved in a suitable solvent). Then the finely divided powder, which has likewise been predispersed in a per se known manner, is added. It is also possible, however, to add the mixture of the two polymer components to the powder dispersion. Various possible production methods are shown in the following examples.

To produce the transfer layer, the coating material is applied onto a suitable layer support by known methods and is then dried.

Suitable layer supports include plastic films such as polyesters, polyamides, polyethylene, polypropylene, polyvinyl chloride, etc.

The thickness of the dried layer is governed by the intended application, but in general should not exceed 10 μm.

In addition to the named constituents, the coating material can also contain other additives such as wetting agents, coating auxiliaries, agents to increase viscosity, adhesion-promoting agents, and the like.

The use of fluorinated wetting agents, as well as the use of high molecular weight polyethylene oxides to increase the viscosity of the coating material, have proven particularly beneficial in the framework of the present invention.

The present process is suitable for developing an image on all light-sensitive layers that can be modified by imagewise exposure into tacky and non-tacky areas. The light-sensitive layer can comprise either positively or negatively tonable systems.

Preferred among suitable positively tonable systems are photohardenable, in particular photopolymerizable systems as described in German Pat. Nos. 1,210,321 (U.S. Pat. No. 3,060,024), 1,904,058 (U.S. Pat. No. 3,620,726), 1,904,059 (U.S. Pat. No. 3,582,327), and 2,004,214. These photopolymerizable systems contain an essential constituents one or more addition polymerizable monomers, a binder or a binder mixture, and a photoinitiator or an initiator system.

Negatively tonable systems are likewise known and described, e.g., in German Pat. Nos. 2,758,209 (U.S. Pat. No. 4,243,741), 3,023,247 (U.S. Pat. No. 4,346,162), and 3,429,615 (U.S. Pat. No. 4,604,340). These systems contain as the light-sensitive components, either a light-sensitive dihydropyridine compound or a light-sensitive system comprising a dihydropyridine compound and a hexaaryl bisimidazole compound.

Light-sensitive systems that contain diffusible plasticizing constituents such as monomers or plasticizers are preferred in the framework of the present invention. It is assumed that the plasticizing constituents diffuse preferentially into polymer phase (b) during the contact phase and that this is particularly pronounced when the minimum film-forming or glass transition temperature of phase (b) lies below the temperature at which the photosensitive layer and transfer layer are brought into contact with one another. The imagewise differentiation of adhesion and cohesion of the transfer layer caused by this diffusion leads to a particularly good image quality.

This result was surprising, since it is known from DE-PS No. 2,949,462 that good image quality is only achievable if there is no plasticizer migration from the light-sensitive layer into the transfer layer.

The light-sensitive materials have maximum sensitivity in the ultraviolet range, preferably in the wavelength range between 250 and 450 nm. Thus all radiation sources which deliver an effective quantity of this radiation, are suitable for the exposure, e.g., xenon lamps, mercury vapor lamps and carbon arc lamps, lasers, fluorescent lamps with phosphors emitting UV radiation, and electronic flash apparatus.

The process of the invention can be used advantageously to reproduce line- and half-tone images for use in the graphic arts and other areas of industry, for the production of maps, print advertising materials, posters, illuminated letters, and for the production of printed circuits.

The main application area, however, is in the production of monochrome or color images and in its use for color-proofing processes.

Color-proofing according to the present invention usually includes the following steps: the light-sensitive material, e.g., a laminate comprising a photopolymerizable layer applied onto a support film and having a cover film, is applied onto an image-receiving material after the cover film has been removed, and is exposed through the transparent layer support using a screened color separation positive or negative, depending on whether it is a positive or negative system, of a first color as an original with actinic radiation to form tacky and non-tacky areas and the transfer layer is laminated onto the exposed layer and peeled off again. A color image of the original is obtained. A second laminate of the light-sensitive material is laminated onto the image after removal of the cover film and is exposed under the same conditions through a screened color separation negative or positive of a second color as an original and is toned by laminating the transfer layer on and peeling it off again. This process is then repeated for a color separation of a third color and, if desired, for a black separation as well. A four-color image faithful to the originals is obtained.

A particular advantage of the process of the invention consists in that, starting from a positive light-sensitive system, four-color overlays and a positive color proofing print can be produced therefrom even with negative color separations as the original.

According to the previous state of the art, to produce a positive color proofing print using negative color separations as the original it was necessary to use a negative working light-sensitive reproduction material.

If negative color separations are used as the starting point, a proofing print is first produced by the method given above. The residual images remaining on the transfer layers used to transfer the partial colors are then laminated one on top of the other to produce the proofing print, using adhesive interlayers, with the application of pressure and/or heat, and subsequent peeling-off of the layer support.

According to another embodiment, however, it is also possible to lay the residual images remaining on the transfer layers one on top of the other as an overlay.

The phrase "consisting essentially of" is used herein in its usual sense to limit the scope of the claims to the specified ingredients and those other ingredients that do not materially affect the basic and novel characteristics of the composition.

EXAMPLES

The following examples are intended to illustrate the invention:

Example 1

To produce a transfer layer of the invention, a coating material of the following composition is produced:

64 g of a 30 wt.-% latex comprising a copolymer of 2-ethyl hexyl acrylate, methyl methacrylate, and methacrylic acid (70/28/2 parts by weight), having a weight average molecular weight of 10,000 and an MFT $<0°$ C. are added under agitation to 346 g of a 32 wt.-% latex comprising a copolymer of methyl methacrylate and methacrylic acid (98/2 parts by weight) having an MFT $>95°$ C. Then 18.6 g of a dispersion of a finely divided cyan pigment are added slowly while stirring. To produce the pigment dispersion, the following constituents 80.2 g of deionized water
3.9 g of sodium lauryl sulfate
10.9 g of ethylated octyl phenol
9.3 g of a copolymer of acrylic acid and an acrylate comonomer, neutralized with alkali, as a dispersant
45.0 g of cyan pigment based on copper phthalocyanine (C.I. 74160)

were ground for 1 hr in a commercial dispersing mill at 5,000 rpm.

A viscosity-increasing agent and a solution containing wetting- and coating auxiliary agents of the following composition:

217.0 g of deionized water
332.0 g of a 1 wt.-% solution of polyethylene oxide, weight average molecular weight 2,000,000
6.1 g of ethylated octyl phenol wetting agent
6.6 g of anionic fluorinated wetting agent are then added to the coating material while stirring.

After good homogenization, the coating material is then applied onto a polyethylene terephthalate film (25 μm) so that a 3 μm-thick layer is obtained after drying.

To produce the colored image, a positively tonable photopolymerizable layer produced according to the data of Example 1 of U.S. Pat. No. 4,356,253—optionally after removing the cover film—is laminated onto an image-receiving material and is exposed through a screened positive cyan color separation in a vacuum copying frame with a metal halide lamp (3000 W) using an ultraviolet filter (Kokomo filter) for 42 s at a distance of 95 cm. After the layer support has been removed, the transfer layer containing the toner material is laminated onto the imagewise exposed layer and is peeled off again immediately. The transfer layer only adheres to the unexposed tacky areas and a positive cyan image of the original is obtained with a resolution of 2%-98% dots in the 60 line/cm screen.

Example 2

A transfer layer comprising the following constituents is produced:

55 g of an alkali-neutralized acrylic copolymer that contains methacrylic acid and acrylonitrile and has an MFT <1° C. are added while stirring to 840 g of a 38 wt.-% latex comprising a copolymer of methyl methacrylate and methacrylic acid (97/3 parts by weight) having an MFT >90° C. Then 48 g of a pigment dispersion produced according to the data of Example 1 are added likewise while stirring.

A solution of
1524.00 g of deionized water and
21.60 g of anionic fluorinated wetting agent
is then also added to the coating material while stirring.

After good homogenization, the coating material is then applied onto a polyethylene terephthalate film (25 μm) so that after drying a 3 μm-thick layer is obtained.

To produce the colored images, the transfer layer is then laminated onto a photosensitive material produced and exposed according to the data of Example 1 and is peeled off again. The colored transfer layer adheres only to the unexposed tacky areas and a positive cyan image of the original is obtained with a resolution of 2%-98% dots in the 60 lines/cm screen.

Example 3

A transfer layer comprising the following constituents is produced:

340 g of a 33.5 wt.-% latex comprising a copolymer of methyl methacrylate and methacrylic acid (98/2 parts by weight) and an MFT >95° C. are added while stirring to 63 g of a 31.5 wt.-% latex comprising a terpolymer of 2-ethyl hexyl acrylate, methyl methacrylate, and methacrylic acid (70/28/2 parts by weight) having a weight average molecular weight of 10,000 and an MFT <0° C. Then 28 g of a pigment dispersion produced according to the data of Example 1 are likewise added while stirring.

A solution of the following constituents:
285.00 g of 1 wt.-% polyethylene oxide, weight average molecular weight 2,000,000
3.42 g of anionic fluorinated wetting agent
5.41 g of ethylated octyl phenol wetting agent
279.00 g of deionized water
is then added to the coating material.

After good homogenization, the coating material is then applied onto a polyethylene terephthalate film (25 μm) so that after drying a 3 μm-thick layer is obtained.

To produce the colored image, the transfer layer is then laminated onto a material produced and exposed according to the data of Example 1 and is peeled off again. The colored transfer layer only adheres to the unexposed tacky areas and a positive cyan image of the original is obtained with a resolution of 2%-98% dots in the 60 line/cm screen.

Example 4

Two of the same transfer layers, A and B, are prepared from the following constituents:

480 g of a 1 wt.-% solution of polyethylene oxide having a weight average molecular weight of 2,000,000 and a glass transition temperature of −67° C.; 10 g of a pigment dispersion produced according to the data of Example 1; and 0.96 g of an anionic fluorinated wetting agent are stirred, one after the other into 104.80 g of a 33.5 wt.-% latex comprising a copolymer of methyl methacrylate and methacrylic acid (98/2 parts by weight), having an MFT >95° C. After good homogenization, the coating material is then applied onto two polyethylene terephthalate films (25 μm) so that after drying a 3 μm-thick layer is obtained.

To produce the colored images, the transfer layer A is then laminated onto a material produced and exposed according to the data of Example 1 and is peeled off again. The colored transfer layer adheres only to the unexposed tacky areas and a positive cyan image of the original is obtained with a resolution of 2%-98% dots in the 60 line/cm screen.

The transfer layer B is laminated onto a negatively tonable reproduction material produced and exposed according to the data of Example 7 of DE No. 2,758,209 (U.S. Pat. No. 4,243,741), which contains a light-sensitive system consisting of a dihydropyridine compound and a hexaaryl bisimidazole compound, and is peeled off again. The colored transfer layer adheres only to the exposed, tacky areas and in this case a cyan image of the negative original is obtained with a resolution of 2%-98% dots in the 60 line/cm screen.

Example 5

To produce a 4-color image, four transfer layers of the colors cyan, magenta, yellow, and black, are produced as follows:

47 g of an alkali-neutralized acrylic copolymer that contains methacrylic acid and acrylonitrile, that has an MFT <1° C., are added while stirring to 605 g of a 38 wt.-% latex comprising a copolymer of methyl methacrylate and methacrylic acid (97/3 parts by weight) having an MFT >95° C. The coating material is then divided into four parts (a)-(d) and the additives listed in Table 1 are added to the individual samples.

TABLE 1

| | (all data in g) | | | |
|---|---|---|---|---|
| Additives | Sample (a) Cyan | Sample (b) Magenta | Sample (c) Yellow | Sample (d) Black |
| Color pigment dispersion pretreated according to Example 1 | 80 | 81 | 104 | 117 |
| 1 wt % solution of polyethylene oxide weight average MW 2,000,000 | 648 | 648 | 648 | 600 |
| Deionized water | 590 | 590 | 590 | 658 |
| Anionic fluorinated wetting agent | 13 | 13 | 13 | 12 |

The color pigments were ground according to the data of Example 1.

A commercial cyan pigment based on copper phthalocyan (C.I. 74160) is used for the production of the cyan transfer layer, and a mixture of magenta pigment RV 6803 (C.I. Pigment Red 122) and Magenta Pigment R 6300 (C.I. Pigment Red 123) is used for the magenta transfer layer. The transfer layers for yellow and black contain Permanent Yellow GG (C.I. Pigment Yellow 17) and Cabot Black R (C.I. Pigment Black 7) as color pigment.

After good homogenization the coating materials (a)–(d) are then applied onto a polyethylene terephthalate film (25 μm) so that a 3 μm-thick colored layer is obtained after drying. The color density of the individual layers is:

Cyan: 1.35
Yellow: 0.83
Magenta: 1.22
Black: 1.60

To produce a four-color proofing print, a positively tonable photopolymerizable layer produced according to the data of Example 1 of U.S. Pat. No. 4,356,253—optionally after removing the cover film—is laminated onto an image-receiving material and is exposed through a screened positive cyan color separation in a vacuum copying frame with a metal halide lamp (3000 W) using an ultraviolet filter (Kokomo filter) for 42 s at a distance of 95 cm. After the layer support has been removed, the transfer layer (a) containing the pigment material is laminated onto the imagewise exposed layer and is peeled off again immediately. The transfer layer adheres only to the unexposed tacky areas, and a positive cyan image of the original is obtained.

A second layer of the positively tonable photopolymerizable reproduction material is laminated onto the cyan image, and is exposed as above through the corresponding screened magenta color separation. After removal of the layer support, the transfer layer (b) containing the pigment material is laminated onto the imagewise exposed layer and is peeled off again. The transfer layer adheres only on the unexposed tacky areas and a positive magenta image is obtained. The steps are repeated correspondingly for the colors yellow and black and then a protective layer is applied in the usual manner. A four-color proofing print of excellent brilliance and sharpness with a resolution of 2%–98% dots in the 60 line/cm screen is obtained, which is a faithful reproduction of the original.

Example 6

In this example the transfer layers known from DE No. 2,949,462 (U.S. Pat. No. 4,275,140) are compared with the transfer layers of the invention.

Sample A
A transfer layer that contains
75 wt.-% of pigment (cyan pigment based on copper phthalocyan C.I. 74160) and
25 wt.-% of elastomer binder (butadiene/styrene copolymer 55/45)
is produced according to the data given in Example 1 of DE No. 2,949,462 (U.S. Pat. No. 4,275,140) and is applied onto a polyethylene terephthalate film (25 μm) so that the layer thickness after drying if 4 μm.

Sample B
A second transfer layer is produced that differs from Sample A only in that it contains
37.5 wt.-% of pigment and
62.5 wt.-% of elastomer binder.

Example C
A 4 μm-thick transfer layer according to Example 1 of the present invention serves as Sample C.

The three transfer layers are then each laminated onto a positively tonable photopolymerizable layer exposed according to the data of Example 1 to produce the image and are peeled off again. The results obtained are summarized in Table 2:

TABLE 2

| Samples | Cyan standard density in offset print 1.35 + 0.05 | Standard resolution in offset print 2%–98% dots in the 60 line/cm screen |
| --- | --- | --- |
| Sample A | 2.20 | Only thick lines were reproduced |
| Sample B | 1.65 | No image |
| Sample C | 1.36 | 2%–98% dots in the 60 line/cm screen |

It is clear from the Table that the required resolution can only be achieved with the transfer layers of the invention.

With the transfer layers according to the state of the art known from DE-PS No. 2,949,462 (U.S. Pat. No. 4,275,140), resolution is insufficient and the densities obtained are much too high. Moreover, the density cannot be lowered sufficiently, even by lowering the pigment content to values that lie outside the range recited in the patent (Sample B).

What is claimed is:

1. In a process for producing an image on a tonable light-sensitive layer comprising the steps of:
    (A) exposing the light-sensitive layer imagewise to produce imagewise tacky and complementary non-tacky areas;
    (B) bringing the imagewise-exposed layer into surface-to-surface contact with a supported non-photosensitive transfer layer containing at least one finely divided powder and/or a dissolved dye in a binder; and
    (C) separating the transfer layer from the light-sensitive layer, whereby the transfer layer adheres selectively to the imagewise tacky areas,
the improvement wherein, the binder of the transfer layer consists essentially of
    (a) about 55–97 wt.% of at least one polymer in the form of a powder having a minimum film-forming temperature of above 50° C., and
    (b) about 3–45 wt.% of at least one thermoplastic and/or one thermoplastic-elastomeric polymer, having a minimum film-forming temperature when used as a latex, or, a glass transition temperature when used as a dissolved polymer, which is at least 10° C. lower than the minimum film-forming temperature of polymer (a), whereby polymer phases (a) and (b) are incompatible and wherein the transfer layer is prepared by mixing said finely divided powder and/or dissolved dye, together with polymer (a), and polymer (b), to form a uniform composition, which is then coated on a support, and dried to form the transfer layer.

2. A process according to claim 1, wherein polymer phase (b) of the transfer layer has a minimum film-forming temperature or glass transition temperature, respectively, which is lower than the temperature at which the imagewise exposed layer and the transfer layer are brought into contact with each other.

3. A process according to claim 1, wherein polymer phase (b) of the transfer layer has a minimum film-forming temperature or glass transition temperature, respectively, that is less than 50° C.

4. A process according to claim 2, wherein polymer phase (b) of the transfer layer has a minimum film-forming temperature or glass transition temperature, respectively, that is less than 50° C.

5. A process according to claim 1, wherein polymer phase (a) of the transfer layer consists essentially of a methacrylic acid ester/methacrylic acid copolymer and wherein polymer phase (b) contains a polyethylene oxide polymer having a weight average molecular weight greater than 500,000.

6. A process according to claim 1, wherein the tonable light-sensitive layer is photopolymerizable, containing at least one photopolymerizable monomer, a photoinitiator or initiator system, and a binder or binder mixture.

7. A process according to claim 1, wherein the tonable light-sensitive layer contains a diffusible plasticizing constituent.

8. A process according to claim 6, wherein the tonable light-sensitive layer contains a diffusible plasticizing constituent.

9. In a process for the production of a multi-colored image comprising the steps of:

(A) applying a tonable light-sensitive layer to a support;

(B) exposing said light-sensitive layer imagewise to produce imagewise tacky and complementary nontacky image areas;

(C) bringing into contact with said exposed light-sensitive layer a nonphotosensitive supported transfer layer containing a finely divided pigment and/or a dissolved dye in a binder, whereby the transfer layer adheres selectively to the tacky image areas;

(D) removing the transfer layer with the nonadhering areas of the transfer layer;

(E) applying another light-sensitive layer onto the image formed; and (F) repeating steps (B)–(E) several times, wherein each light-sensitive layer is exposed in register using a different color-separation transparency and contacted with a correspondingly colored transfer layer; the improvement wherein the binder of the transfer layer consists essentially of (a) about 55–97 wt.% of at least one polymer in the form of a powder having a minimum film-forming temperature of above 50° C., and (b) about 3–45 wt.% of at least one thermoplastic and/or one thermoplastic/elastomeric polymer, having a minimum film-forming temperature when used as a latex, or, a glass transition temperature when used as a dissolved polymer, which is at least 10° C. lower than the minimum film-forming temperature of polymer (a), whereby polymer phases (a) and (b) are incompatible.

* * * * *